US006980074B1

(12) United States Patent
Jitaru (10) Patent No.: US 6,980,074 B1
(45) Date of Patent: Dec. 27, 2005

(54) LOW NOISE FULL INTEGRATED MULTILAYERS MAGNETIC FOR POWER CONVERTERS

(75) Inventor: Ionel Jitaru, Tucson, AZ (US)

(73) Assignee: Delta Energy Systems (Switzerland) AG, Bern-Bumplitz (CH)

( * ) Notice: Subject to any disclaimer, the term of this patent is extended or adjusted under 35 U.S.C. 154(b) by 0 days.

(21) Appl. No.: 09/434,985

(22) Filed: Nov. 5, 1999

Related U.S. Application Data (63) Continuation of application No. 08/351,943, filed on Dec. 8, 1994, now Pat. No. 5,990,776.

(51) Int. Cl.$^7$ ................................................. H01F 5/00
(52) U.S. Cl. ......................... 336/200; 336/223; 336/232
(58) Field of Search ................................ 336/200, 223, 336/232

(56) References Cited

U.S. PATENT DOCUMENTS

| | | | |
|---|---|---|---|
| 4,622,627 A | * 11/1986 | Rodriguez et al. | ............. 363/37 |
| 4,730,241 A | 3/1988 | Takaya | |
| 4,873,757 A | 10/1989 | Williams | .................... 29/602.1 |
| 5,126,714 A | 6/1992 | Johnson | |
| 5,184,103 A | 2/1993 | Gadreau et al. | |
| 5,312,674 A | 5/1994 | Haertling et al. | |
| 5,321,380 A | * 6/1994 | Godek et al. | ................ 336/232 |
| 5,353,001 A | 10/1994 | Meinel et al. | |
| 5,532,667 A | * 7/1996 | Haertling et al. | ............. 336/177 |
| 5,565,837 A | * 10/1996 | Godek et al. | ................ 336/232 |
| 5,754,088 A | 5/1998 | Fletcher et al. | |
| 5,929,733 A | 7/1999 | Anzawa et al. | ................ 336/61 |
| 5,949,191 A | * 9/1999 | Cassese et al. | ................ 315/82 |
| 6,069,548 A | 5/2000 | Baarman et al. | |
| 6,073,339 A | * 6/2000 | Levin | ........................... 29/606 |
| 6,724,290 B1 | * 4/2004 | Ohnmacht et al. | ........... 336/200 |
| 2002/0036561 A1 | * 3/2002 | Jedlitschka | ................. 336/232 |

FOREIGN PATENT DOCUMENTS

JP     1-100471     7/1999

OTHER PUBLICATIONS

Bijan E. Mohandes, "Designing High Frequency PWM Converters Using Integrated PCB Transformers" Apr. 1994, pp. 551–560.
H. Martin et al., "Improved Multi–Phase Coupled Inductor Topologies", HFPC—May 1992 Proceedings, pp. 340–349.

* cited by examiner

Primary Examiner—Ann Mai
(74) Attorney, Agent, or Firm—Gallagher & Kennedy, P.A.; Thomas D. MacBlain (57) ABSTRACT

A multilayer structure in which all the magnetic elements have the windings edged in the inner layers and the magnetic core which surrounds the winding has the legs penetrating through the multilayer structure. The interconnection between the magnetic elements and the rest of electronic components is done through the layers of the multilayer board, horizontally and vertically through via. For higher power components special cuts are performed in the multilayer board to accommodate the body of the components which may be connected to an external heatsink. The winding arrangement in the transformer is done in a such way to minimize and even eliminate the common mode noise injected through the capacitance between primary and secondary winding. The input filter is constructed to exhibit a differential and a common mode impedance. Supplementary capacitors are incorporated in the multilayers structure to offer a low impedance to the noise to short it to the source, or for injecting currents of opposite polarity to cancel the common mode current transferred through the transformer's inter winding capacitance and through the parasitic capacitance of the switching elements to the secondary. The insulation between winding can be in accordance with the safety agency requirements, allowing much shorter creapage distances inside of the multilayer PCB structure than in the air due to the compliance with coating environment.

54 Claims, 6 Drawing Sheets

LOW NOISE FULL INTEGRATED MULTILAYERS MAGNETIC FOR POWER CONVERTERS

RELATED APPLICATIONS

This is a continuation of U.S. patent application Ser. No. 08/351,943, filed on Dec. 8, 1994, now U.S. Pat. No. 5,990,776, and entitled "Low Noise Full Integrated Multilayer Magnetic for Power Converters," incorporated herein by reference.

FIELD OF THE INVENTION

This invention relates to DC-to-DC converters, DC-to-AC, AC-to-AC and AC-to-DC converters. The major characteristic of this power conversion technique is that all the magnetic elements are implemented on the same multilayers structure, and the power transfer is made highly efficient and common mode noise is minimized.

BACKGROUND OF INVENTION

There is a continuing industry demand for increasing power density, which means more power transferred in a given volume. A method for increasing the power transfer through the converter is to increase the switching frequency in order to minimize the size of magnetics and capacitors. Using prior art topologies such as forward or flyback, which employ "hard" switching techniques, makes high frequency operation less efficient. The switching losses associated with switch elements, which turn on when there is a voltage across them, are proportional with the switching frequency. An increase in switching frequency leads to an increase in switching losses and an increase in level of electromagnetic interference (EMI).

In order to overcome limitations in switching speeds, the prior art has devised a new family of resonant and quasi-resonant converters. In the case of quasi-resonant converters, the prior art technique consists of shaping the current or voltage to become half-sinusoidal and to perform the switching when the current or voltage reaches zero. The reactive elements, which contribute to shaping the current or voltage, are part of the basic circuit and are considered undesirable in classic topologies. An example of one such circuit can be found in Vinciarelli, "Forward Converter Switching at Zero Current", U.S. Pat. No. 4,415,959. The technique utilized by Vinciarelli consists of adding a resonant capacitor across the fly wheeling diode to create a resonant circuit in combination with the leakage inductance of the transformer. During the ON time of the main switch, a current charges the resonant capacitor. When the current reaches zero, the main switch turns OFF in the primary of the transformer. The output inductor discharges the resonant capacitor, transferring the energy to the load. This topology exhibits several drawbacks which limit its utilization to power under 200 W.

Another family of quasi-resonant converters which switch at zero voltage is described by F. C. Lee in High Frequency Power Conversion International Proceedings (April 1987), Intertec Communications, Ventura, Calif. These prior art circuits operate similarly to those described above with the exception that the main switch turns ON and OFF at zero voltage. Despite the advantage this has at the main switch the frequency modulation which is required for controlling the output power makes this topology unattractive.

New topologies which are refereed to as "Soft Transition Technologies" were developed, in order to eliminate the limitations associated with quasi-resonant and resonant converters, but to still maintain the advantage of soft commutations for the switching elements. Such technologies are described by I. Jitaru in "Fixed Frequency Single Ended Forward Converter Switching at Zero Voltage," U.S. Pat. No. 5,126,931, and in "Square Wave Converter Having an Improved Zero Voltage Switching Operations," : U.S. Pat. No. 5,231,563. Using these topologies the converter operates at constant frequency, modulating the power by varying the duly cycle, the current and voltages on the switching elements are square-wave to decrease the current and voltages stress, the transitions are done at zero voltage conditions, and the power is transferred to the output, both during the ON time and OFF time.

These latest topologies have proven superior in respect of efficiency over the previous resonant and Quasi-resonant topologies. However, the parasitic elements of the circuit such as leakage inductance and stray inductance, will negatively affect the efficiency due the circulating energy contained in these parasitic elements. Due to the inter-winding capacitance of the transformer the common mode noise will be injected into the secondary. In planar, low profile magnetics required for low profile packaging the inter-winding capacitance is larger, and as a result the common mode noise injected via parasitic capacitance is larger.

BRIEF SUMMARY OF THE INVENTION

Power processing devices according to this invention offer a construction technique of the main transformer which also extends to all the magnetic elements, wherein the parasitic elements of the circuit are minimized. At the same time the common mode current injected to the secondary via the inter-winding capacitance is reduced and even eliminated. The construction technique provided in the power processing devices of this invention offers a simple and low cost method to further suppress the differential and common mode noise at the converter level. This novel construction technique offers an avenue to increasing the power density of the converter and allows full compliance with the requirements of safety agencies.

The planar multilayer magnetic is characterized by the use of flat copper spirals located on separate dielectric layers. Each layer can contain one turn or multiple spiral turns. The interconnection between the layers can be done by vias or an interconnecting trace. The insulator material can be laminated epoxy filled board, such as FR4 or a different dialectic material. The planar multilayer structure has been described by A. Estrov in "Power Transformer Design for 1 Mhz Resonant Converter" at High Frequency Power Conversion in 1986. However, by decreasing the height of the planar magnetic the footprint will increase in order to maintain the same winding resistance. This will sacrifice the power density of the converter. In the exemplary embodiment of power processing devices according to this invention the transformer winding is buried between a minimum of two layers of dialectic and the space on top of the winding can be populated with surface mounted components for a better volumetric efficiency. Exemplary devices in accordance with the invention provide several winding structures in a planar transformer, designed to minimize common mode noise. The exemplary embodiments further provide a full integrated multilayer structure in which all the magnetic elements are located on the same multilayer structure. The winding arrangements in the input and output inductor are also structured to minimize the common mode noise. It further utilizes the inter-layer capacitance to create a low impedance for the common mode and differential mode noise, and to short it back to the source. To compensate for the common mode noise injected by the primary switching elements into the common baseplate to the secondary, the power processing devices according to the invention provide a noise cancellation technique by injecting into the secondary a common mode current of the same amplitude, but in opposite phase, through the common baseplate or through the multilayer structure. In certain exemplary embodiments of the invention a packaging configuration is provided in which some the components of the converter are surface mounted, located on the same multilayer structure, and for higher power applications, cuts in the multilayer structure allow for the body of the power components. The heat-sink of the power components may be connected to external heat-sinks.

DETAILED DESCRIPTION OF THE PREFERRED EMBODIMENTS

The multilayer planar magnetic, in which the windings are continuous flat copper spirals located on separate dielectric substrates, have been used before for signal and data processing. In the power conversion field the multilayer magnetic have been used since 1986. However, there are several limitations with multilayer magnetic which prevented this technology from a large utilization. Decreasing the height of the magnetic, by utilizing flat windings, leads to an increased footprint. As a result a large portion of the board on which the multilayer planar magnetic is mounted, cannot be used for another purpose, having a negative impact on the volumetric efficiency. Another limitation associated with planar multilayer magnetic is the increased inter-winding capacitance, which leads to higher switching losses on the switching elements and a larger common mode current injected to the secondary via the capacitance between primary and secondary windings. The parasitic elements such as the leakage inductance can be decreased in planar multilayer technology, but there is still the negative effect of parasitic elements associated with the interconnection pins. The interconnection pins will add to the cost of the magnetic and also will contribute an increase in losses.

Figure 1:
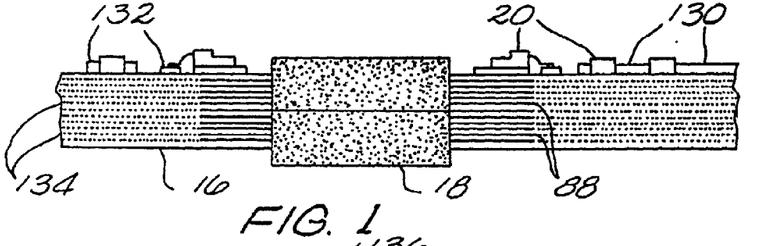
FIG. 1 is a fragmentary cross-section view of the buried multilayer magnetic for a better volumetric efficiency.

Turning now to FIG. 1 wherein a methodology of the invention is illustrated. The planar windings of the magnetic 18 are incorporated are incorporated in a multilayer PCB structure 16. The top and bottom layer of the multilayer board 16 are utilized for interconnection and for pads of power components 20, or for shielding purposes or different other interconnections. By burying the magnetic winding inside of the multilayer construction the footprint of the magnetic is reduced to the footprint of the core. This allows a better utilization of the board, increasing also the power density. By burying the magnetic inside of an epoxy fulled multilayer structure such as the multilayer PCB, the creapage distances requirement between the windings and the edge of the board or cuts is decreased. This is due to the fact that the spacing between primary and secondary inside of the multilayer PCB has to comply with the coating environment. These spacings are several times smaller than those in the air.

Figure 2:
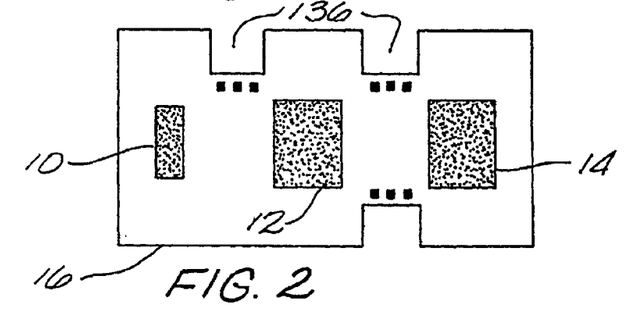
FIG. 2 is a top plan view of an assembled power converter using fully integrated multilayer magnetic.

Another advantage of this construction technique is the fact that the interconnection between the magnetic elements, for example between the transformer and output choke are done through the same multilayer PCB, eliminating the need for interconnection pins. The power components can be located on top of the multilayer PCB, interconnecting with the magnetic winding through vias, or can be located on an external heatsink, using cuts in the PCB tailored to the body of power components as is depicted in FIG. 2. In FIG. 2 is presented a fully integrated multilayer PCB power converter structure which incorporates all the magnetic elements such as the input filter 10, the main transformer 12, and the output choke 14. The body of the power components is accommodated by using cuts in the multilayer PCB structure. The connection of power components to the windings is done by through holes in which the terminals of the components can be soldered to. For lower power levels the power components are located on top of the PCB and through vias or large parallel pads of low thermal impedance extended to the bottom of the multilayer PCB to which an external heatsink can be attached. The additional heatsink may not be required if there is an air flow on top of the converter. The magnetic core 18, has legs penetrating through the multilayer PCB. The core will create a closed magnetic path with or without an air gap, as a function of the electrical topology in which it is utilized.

Figure 3A:
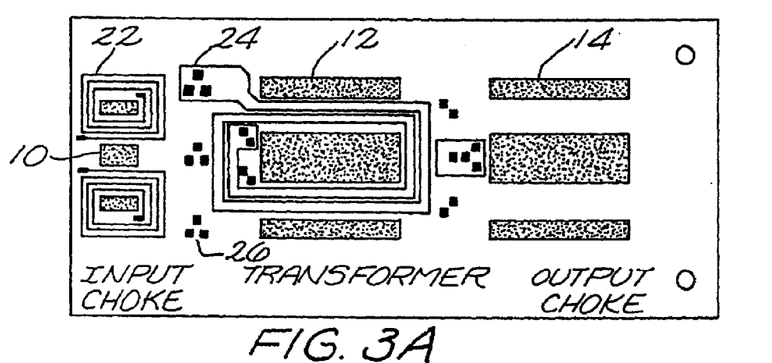
FIG. 3A is a view of an inner layer in the fully integrated multilayer magnetic which contains a section of an input filter choke winding, a section of a transformer's primary winding and a section of the output choke core.

In FIG. 3A the structure of an inner layer contains a section of the input choke winding 22 and a section of the primary winding 24 of the transformer. The cores of the input choke 10, main transformer 12 and output choke 14, penetrate through the multilayer PCB. The vias 26, are designed to interconnect the wing from different layers. Some of the vias are designed to interconnect the magnetic windings to the components located on the top and bottom of the multilayer PCB.

Figure 3B:
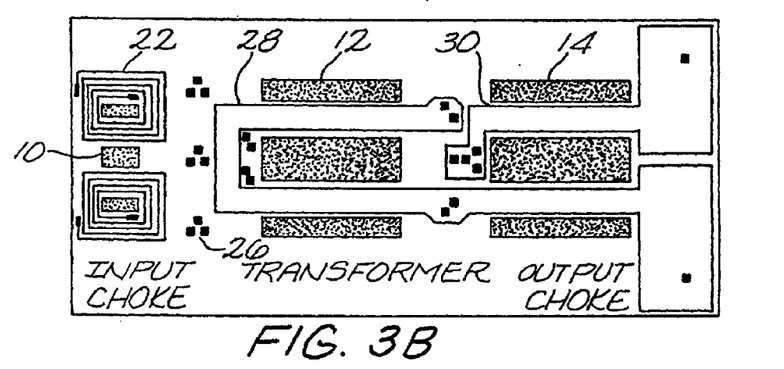
FIG. 3B is a view of an inner layer in the full integrated multilayer magnetic which contains a section of the input choke winding, a section of the transformer's secondary winding and a section of the output choke winding.

In FIG. 3B the structure of an inner layer is shown which contains another section of the input choke winding 22, a section of the secondary winding 28 of the transformer and a section of the winding 30 of the output choke. The connection from the transformer to output choke is done directly without supplementary interconnections, This will minimize the stray inductance associated with the interconnection pins.

One of the novel aspects of this invention is the integration of all the magnetic elements on the same multilayer structure. For a better utilization of space, the magnetic windings are buried inside, allowing the top and bottom layer to be utilized for locating surface mounted components. This leads to a very efficient utilization of the volume due to a three dimensional utilization. This form of integration leads to a minimization of the interconnection impedance and as result leads to a higher efficiency in power processing. The available area on the board of FIGS. 3A and 3B is the area on the top and bottom surfaces not taken up by the footprints of the cores 10, 12 and 14 and thus available for mounting circuit components. Mounting components directly above or below the footprints of the windings 22, 24, 28 and 30 and their end connection pads in the embodiment of FIGS. 3A and 3B frees up slightly more than 30% of the available area for this purpose. Using this real estate on the top and/or bottom surfaces of the multilayer PCB thus enables greatly improving the converter's power density. In a converter like that depicted in FIGS. 3A and 3B in excess of 25% of the surface of the board (the total area inside the perimeter of the board) is made unavailable by the magnetic cores 10, 12 and 14. If the winding footprints are excluded from the area to be populated by surface mounted circuit components then the real estate on surfaces of the board that can be used to mount these components is reduced by nearly half.

Figure 14:
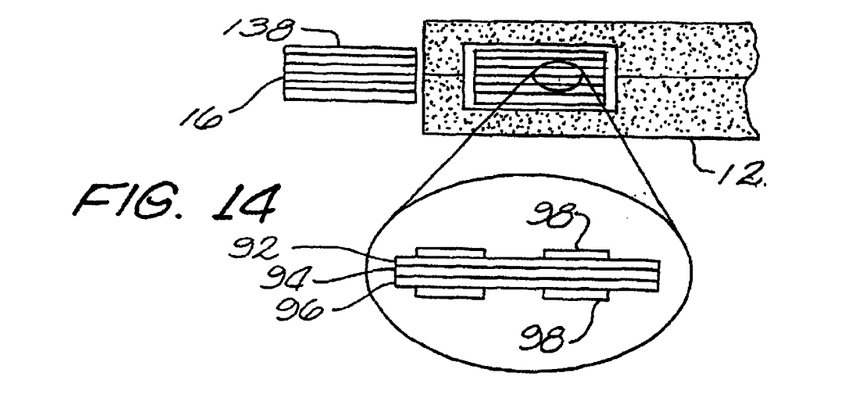
FIG. 14 is a fragmentary diagrammatic illustration of a construction using a method of compliance with IEC950 in which three layers of core material are used, for example FR4, between the prim winding and secondary winding.
Figure 15:
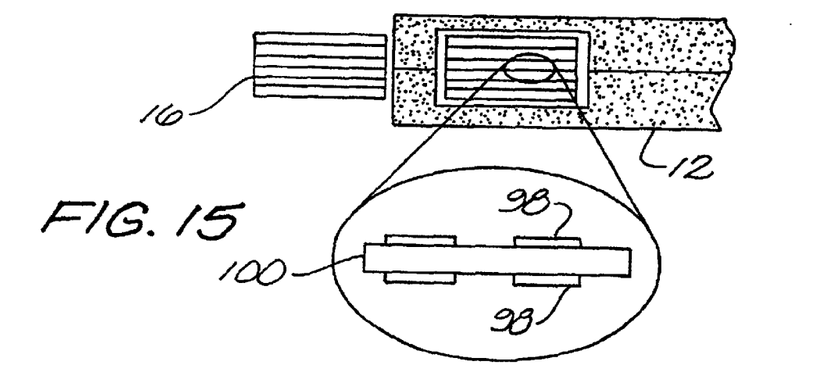
FIG. 15 is a fragmentary diagrammatic illustration of a construction using a second method of compliance with IEC950 wherein the core material between primary and secondary winding has to be thicker than 0.4 mm.
Figure 16:
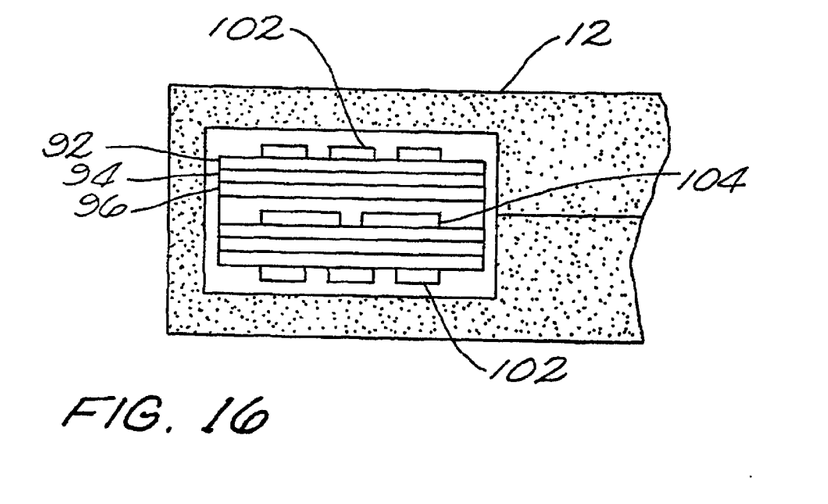
FIG. 16 is a fragmentary diagrammatic illustration of a construction using a method of compliance with safety agencies in which the magnetic core is reported to the primary and the transformer does not have to be buried. The secondary winding has to comply with the creapage distances in accordance with coating environment, based on the RMS voltages measured in the transformer.

The multilayer PCB magnetic offers a good avenue in addressing the creapages and clearance requirements demanded by the safety agencies. By burying the transformer inside of the PCB as is depicted in FIG. 14, the spacing between primary and secondary is determined in accordance with the RMS voltages in transformer applied to a coating environment. These spacing are several times smaller than those in the air. However, between primary and secondary windings two or three layers of core material 92, 94, 96 are demanded, each two able to withstand the dielectric test. Another method requires the core material between the primary and secondary 98, to be at least 0.4 mm. The magnetic core can be reported to the primary or to the secondary. In FIG. 16 an exemplary embodiment is shown case in which the core is reported to the primary. The secondary winding 104 are buried inside and the distance from the secondary winding 104 to the edge of the core slot has to comply with the creapage requirements for the RMS voltage measured in the transformer. Using this method the primary winding 102 and the interconnecting vias do not have to be buried in the multilayer PCB.

Figure 4:
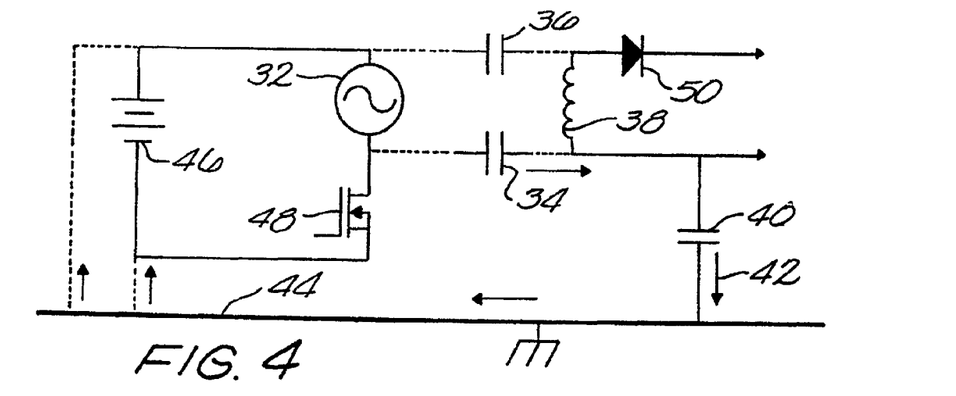
FIG. 4 is a schematic diagram of a power conversion device that depicts the injection of the common mode current through the primary to a secondary winding capacitance, due to the voltage gradient across the primary winding of the transformer.

The AC voltage gradient across each turn of the winding is equal, but reported to the input ground the amplitude of the voltage swing increases from the turn connected to the input DC source to the maximum level to the turn connected to the switching element. As is depicted in FIG. 4, the voltage swing 32 across the primary winding injects a current in the secondary winding 38 via the primary to secondary winding capacitance 34, 36. This current is further flowing through the decoupling capacitor 40, through the earth ground 44, returning through the connections of the input and output leads of the power supply and is a noise parameter that is measured by the FCC and VDE.

Figure 5:
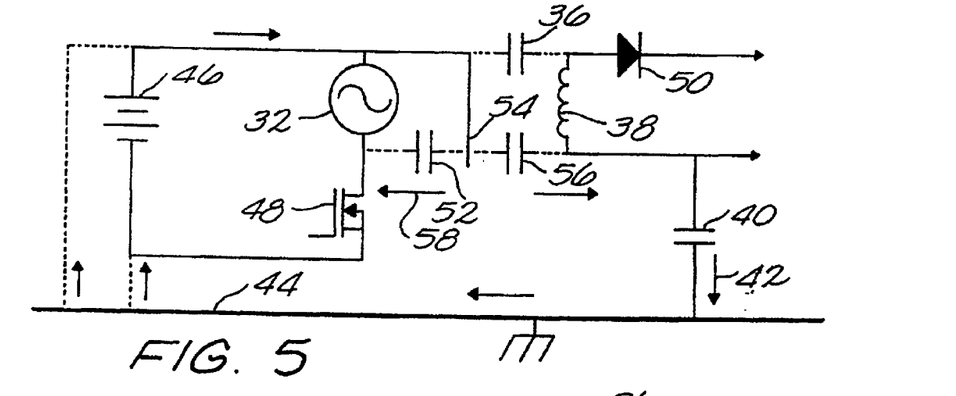
FIG. 5 is a schematic diagram of the power conversion device like that of FIG. 4 that illustrates the effect of a shield between primary and secondary winding in order to decrease the common mode current via the primary to secondary winding capacitance.

As depicted in FIG. 5, one method of suppressing some of the common mode (CM) noise is utilizing a shield 54, or two located between primary and secondary winding and connected to the input DC source or the input ground. The capacitance between the shield 54 and the primary winding creates a low impedance path for the common mode current created by the AC voltage across the primary winding 32. However the stray impedance of the shield itself will create a voltage gradient across it which will inject a common mode current via the capacitance 56 between the shield and the secondary winding 38. This common mode current 42, is reduced in comparison to the structure without the shield. However, the parasitic inductance of the connection to the input DC source 46, is critical for shielding effectiveness. One of the major drawback associated with the use of the shield is the fact that an increased parasitic capacitance will be created across the primary winding and across the secondary winding. This will increase the switching losses on the switching elements. This parasitic capacitance 52 will be in parallel with the inter-winding capacitance of the primary and the parasitic capacitance of the switch itself. The switching losses will become more significant at higher operation frequency and for high input voltage applications such as off-line converters.

Figures 7, 9:
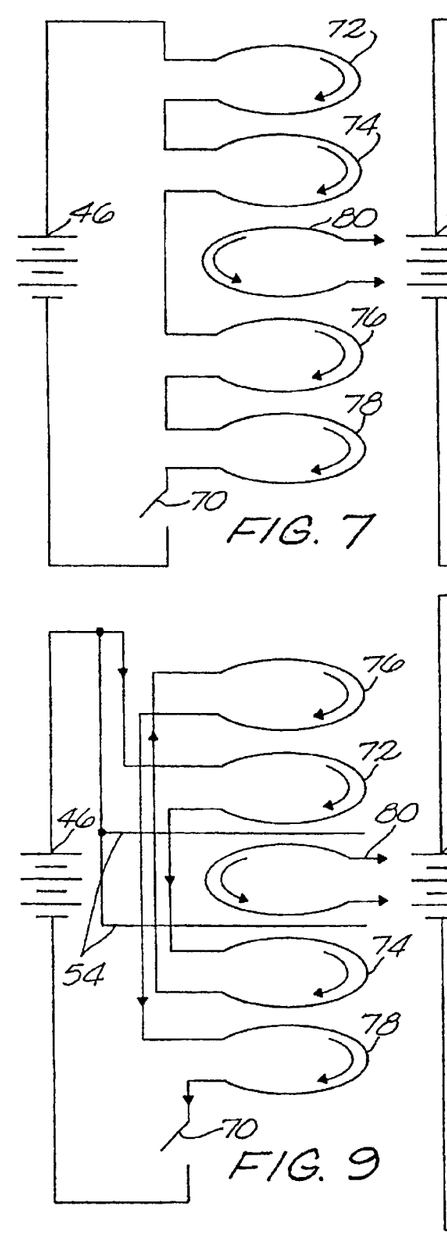
FIG. 7 is a schematic illustration of a typical "sandwich" layer distribution in the transformer for a reduced leakage inductance and a reduced ac copper losses.
FIG. 9 is a schematic illustration a further layer and winding distribute for common mode current reduction by using a shield between the secondary and two "quiet" primary layers.

In FIG. 7, in a winding arrangement in a converter, the secondary windings 80 are sandwiched between the primary windings. For simplicity, I consider that the primary winding of the transformer is contained in four layers and the secondary winding in one layer. The winding of layer 1 connected to the input voltage source 72, exhibits a lower voltage swing reported to the input ground comparative to the winding 78 of layer 4 connected to the switching element 70. In this particular case the voltage swing reported to the primary ground is four times larger for layer 4, 78 than for the layer 1, 72. It is logical to locate the secondary 80 in the vicinity of the "quiet" primary such as 72. However the secondary has to be located symmetrically between primary windings for two reasons. One reason is to minimize the magnetic field intensity between windings for lower AC copper loss, and the second reason is to lower the leakage inductance between primary and secondary.

Figure 8:
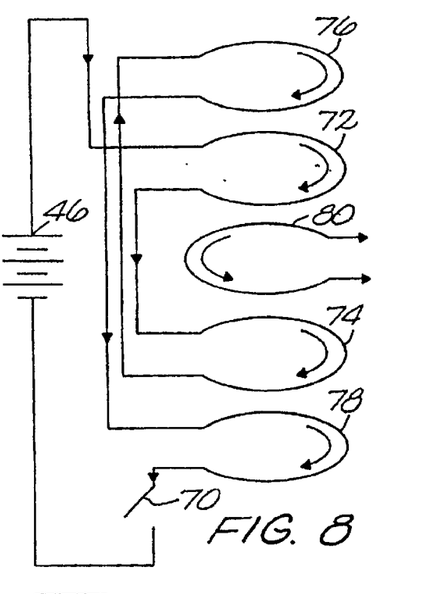
FIG. 8 is a schematic illustration a layer and winding distribution aimed to decreased the common mode current injection to the secondary, by locating the secondary layers in between "quiet" primary layers. Quiet primary windings are those which exhibit a lower amplitude voltage swing in report to the primary ground.

In order to decrease the common mode current injection into the secondary via the capacitance between primary winding to secondary winding, and maintaining at the same time the sandwiched structure, the configuration of FIG. 8 is suggested. In FIG. 8 the secondary winding is located between two quiet layers. The voltage swing across layer 1 is much smaller than the voltage swing across layer 3. This structure does not eliminate the common mode injection to the secondary but it will reduce it. The advantage of this configuration is the fact that it does not require any addition layer.

In FIG. 9 is a configuration in which two layers on the top and the bottom of the secondary are used as a shield 54. The location of the shield in vicinity of two "quiet" layers, layer 1, 72 and layer 2, 74, will not increase significantly the parasitic capacitance across the primary winding. However two layers of the multilayer structure will be allocated to the shield 54.

Figure 10:
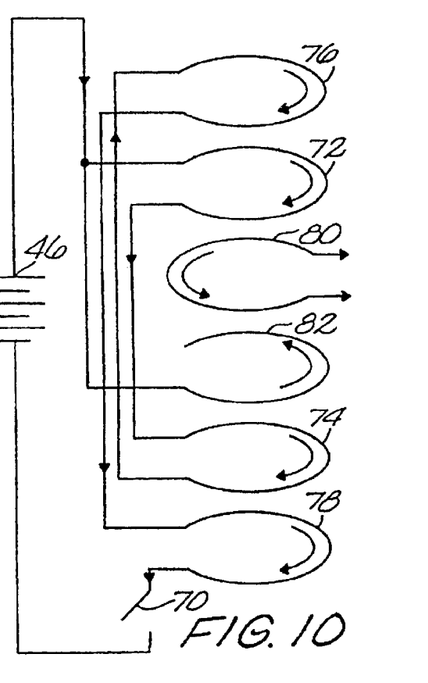
FIG. 10 is a schematic illustration of a further layer and winding distribution that provides a method for the cancellation of the common mode current into the secondary by locating the secondary layers between a "quiet " winding connected to the input DC voltage source and a "noise cancellation winding" which creates a negative imagine of the common mode current injected by the first layer.

A configuration which can reduce the common mode noise injection to the secondary to zero is depicted in FIG. 10. In this configuration a noise cancellation winding 82, is added. The polarity of the voltage swing across this winding is opposite to the polarity of the voltage swing across the winding in a layer 1. As a result the common mode current injected into the secondary winding will be canceled. This method will require only one additional layer and if a perfect geometrical symmetry can be accomplished, the common mode current injected in the secondary can be totally canceled. The single drawback of this is the fact that one layer will be allocated just for the noise cancellation.

Figure 11:
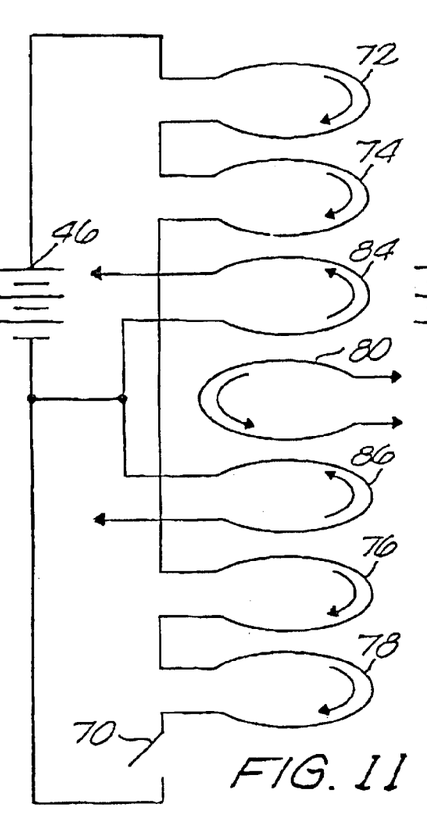
FIG. 11 is a schematic illustration of a configuration in which the secondary windings are located between two symmetrical auxiliary windings, which are wound in a such way to cancel the common mode current injected to the secondary via the primary to secondary winding capacitance.

In FIG. 11 two layers are added, one on top and one on the bottom of the secondary winding. These is windings have a common symmetrical connection which is connected to the input ground. The connection can be also to the input DC voltage source. The voltage swing across the winding 1, 84 and auxiliary winding 2, 86 will inject a common mode current into the secondary, but of the opposite polarity of each other. As a result the total common mode current injected to the secondary will be zero. These auxiliary windings can be utilized to provide power in the primary section such as the necessary bias power, or can provide the power for the primary reported output.

Another path for the common mode current is through the capacitance between the switching elements in the primary and in the secondary, and the baseplate. This applies for higher power applications in which a common heatsink baseplate is used for the power components in the primary and secondary circuits. Due to a large voltage swing of the power switch tab, this source of common mode noise can be dominant. This invention claims a method for cancellation of the common mode current produced by the switching elements. This is done by creating a supplementary capacitor between the secondary and the termination of the noise cancellation winding not connected to the input DC source or input ground. The noise cancellation windings are shown in FIG. 10 and FIG. 11. By properly tailoring this additional capacitance a current will be injected into the secondary, of the same amplitude but in opposite phase to the current injected by the switching elements to the secondary via the capacitance between the switches and the baseplate. The additional capacitance between the noise cancellation winding and secondary can be implemented in the metal baseplate or in the multilayer structure.

Figure 12:
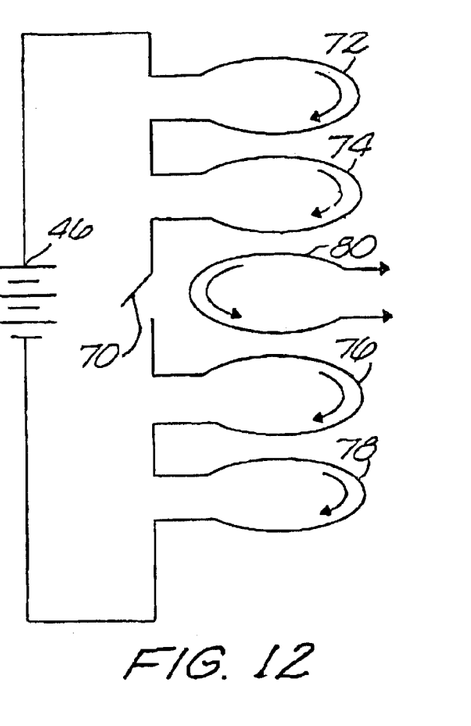
FIG. 12 is a schematic illustration of a configuration in which the switching element is connected in the middle of the primary winding, creating a perfect symmetry in which the common mode current injected into the secondary winding via the primary to secondary capacitance is canceled.

Another method which does not require supplementary layers for output common mode noise cancellation is presented in FIG. 12. In this case the primary winding is symmetrically cut in half and the power switch is connecting to these sections. The voltage swing on the layers which surrounds the secondary, layer 2, 74 and layer 3, 76, will have the same amplitude but will be of opposite polarity. As a result the common mode noise injected into the secondary will be zero.

Figure 6:
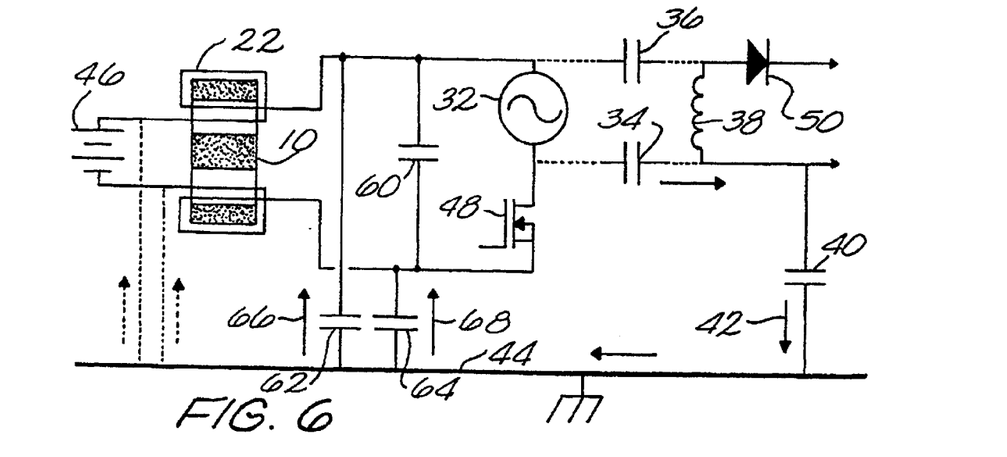
FIG. 6 is a schematic diagram of a power conversion device that illustrates the use of a differential mode and common mode input choke together with two "Y" capacitors in order to reduce the common mode current flowing towards the input source.

The structures presented above will reduce the common mode noise injection to the secondary via the inter-winding capacitance of the transformer. However, if the common mode noise will be generated by different circuitry or if a further reduction of common mode is required, a supplementary common mode filter may be required. Such a structure is shown in FIG. 6. By utilizing a EE or EI core gapped in the center leg, the input choke can exhibit a common mode and a differential mode impedance. By using the outer legs of the core, two inductive elements can be implemented in the PCB. The coupling between these inductor will determine the CM impedance, and it can be tailored by the gapping configuration of the core. For example, if there is not a gap in the core, the coupling coefficient is K=0.071. If there is 1 mill gap in all the legs, K=0.276. If only the center leg is gapped to 2 mil, K=0.724. The common mode and differential mode inductance can be tailored by properly gapping the core, and making sure that under all loading conditions the core does not saturate. Utilizing full integrated multilayer PCB, the cost of the input EMI filter is reduced to the cost of the magnetic core. The capacitors 62, and 64 are used to create a low impede for the common mode current which will work against the high impedance exhibited by the input filter. The capacitors 62 and 64 can be created in the structure of the multilayer PCB, which will lead to a cost reduction of the converter and to a better utilization of the multilayer structure. These capacitors can be constructed to comply with the safety agencies by using the recommendations suggested for the transformer compliance with safety agencies, previously discussed.

Figure 13:
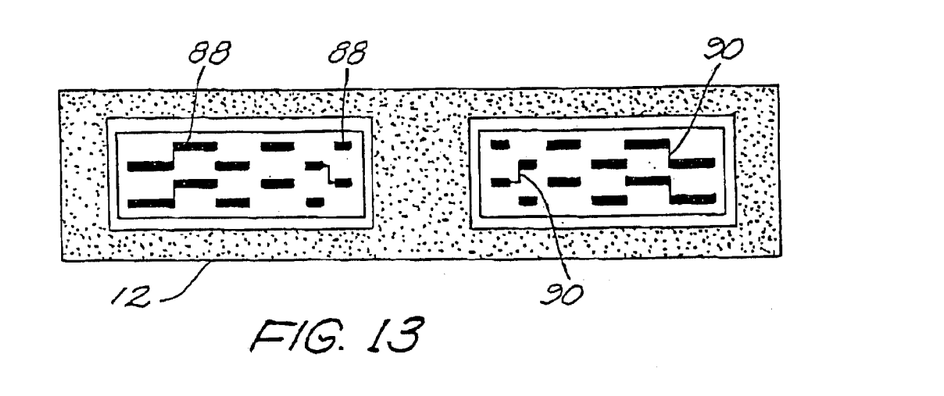
FIG. 13 is a diagrammatic illustration of a winding arrangement in a magnetic element designed to reduce the inter-winding capacitance and for a better utilization of the copper.
Figure 17:
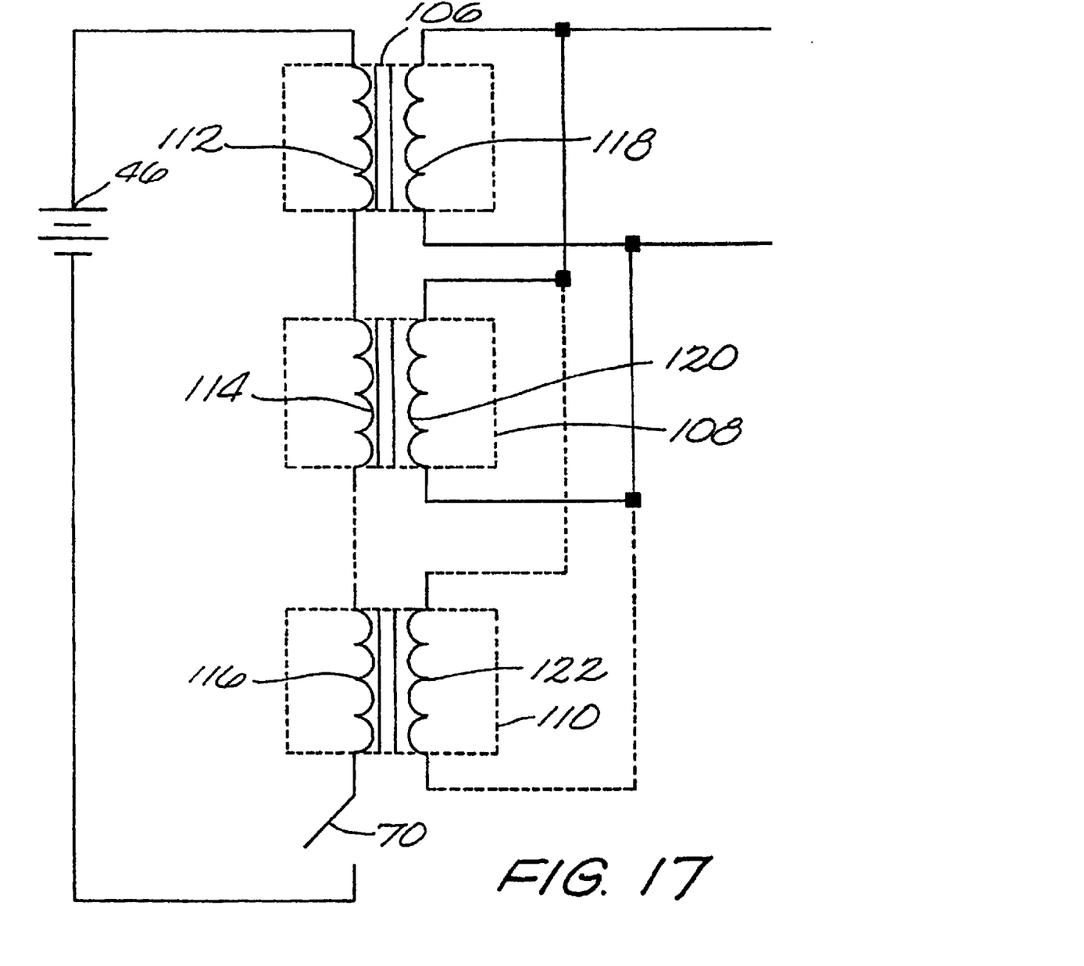
FIG. 17 is a schematic illustration a configuration in which multiple multilayer transformers on the same multilayer structure are utilized for higher power applications or for a reduced number of layers.

FIG. 13 provides reduction of the parasitic capacitance across the magnetic winding. This is accomplished by shifting the adjacent layers. For a better utilization of the copper, the turn width is varied in such a way to ensure an equal resistance per each turn. The turn width is made larger as one moves from the inside turn to the outermost turn so that the winding resistance for the shorter turn can be equal to the winding resistance for the longer turn. For higher power applications or in applications which require large currents multiple planar multilayer transformers can be utilized on the same multilayer structure as is depicted in FIG. 17. The number of layers in primary 112, 114, 116 and in the secondary 118, 120, 122 of these transformers 106, 120, 122 can be reduced to one, which will allow the use of two layer multilayer structure. Another advantage of this configuration is the fact that the leakage inductance in each transformer can be very low, which will make this configuration ideal for high current and low output voltage.

Many alternations and modifications may be made by those having ordinary skill in the art without departing from the spirit and scope of the invention. Therefore, the invention must be understood as being set forth above only for the purpose of example and not by way of limitation. The invention is defined by the following claims wherein means may be substituted therein for obtaining substantially the same result even when not obtained by performing substantially the same function in substantially the same way.

What is claimed is:

1. A power processing device comprising:
   (a) a multilayer printed circuit board having multiple layers of dielectric sheets;
   (b) a first transformer having,
      1) a first core extending through said layers of dielectric sheets, and,
      2) a first set of electrically conductive windings, at least one of said windings of said first set of electrically conductive windings contained between two adjoining layers of said dielectric sheets;
   (c) a second transformer having,
      1) a second core extending through said layers of dielectric sheets, and,
      2) a second set of electrically conductive windings, at least one of said windings of said second set of electrically conductive windings contained between two adjoining layers of said dielectric sheets; and,
   (d) at least one electrically conductive trace extending between said first set of electrically conductive windings and said second set of electrically conductive windings, said at least one electrically conductive trace contained between two adjoining layers of said dielectric sheets.

2. The power processing device according to claim 1, further including a first shielding layer on a first exterior surface of said multilayer printed circuit board, said first shielding layer being disposed between a first winding of said first set of windings and a winding of said second set of windings.

3. The power processing device according to claim 2, further including a second shielding layer disposed on a second exterior surface of said multilayer printed circuit board, said second shielding layer being disposed between a second winding of said first set of windings and said winding of said second set of windings.

4. The power processing device according to claim 1, wherein said first set of electrically conductive windings and the second set of electrically conductive windings are electrically encapsulated.

5. The power processing device according to claim 4, wherein said at least one electrically conductive trace is electrically encapsulated.

6. The power processing device according to claim 1,
   (a) wherein said first set of electrically conductive windings include quiet windings; and,
   (b) wherein said first transformer further includes a secondary set of windings positioned to have electrical flow induced therein by said first core, said secondary set of windings positioned proximate to said quiet windings.

7. The power processing device according to claim 1,
   (a) wherein said first transformer further includes a secondary set of windings positioned to have electrical flow induced therein by said first core; and,
   (b) further including an open loop positioned to inject a current through parasitic capacitance in said secondary windings having a polarity opposite that of current in said first set of windings.

8. The power processing device according to claim 1,
   (a) wherein said first transformer further includes a secondary set of windings positioned to have electrical flow induced therein by said first core; and,
   (b) further including an open loop positioned proximate and on a second side of said secondary windings.

9. The power processing device according to claim 1,
   (a) wherein said first transformer includes a secondary winding;
   (b) wherein said second transformer includes a secondary winding;
   (c) wherein the secondary winding of said first transformer and the secondary winding of said second transformer are electrically connected in parallel; and,
   (d) wherein the first set of electrically conductive windings and the second set of electrically conductive windings are electrically connected in series.

10. A power processing device comprising:
    (a) a multilayer printed circuit board having multiple layers of dielectric sheets;
    (b) a transformer having,
       1) a core extending through said layers of dielectric sheets; and
       2) a first set of electrically conductive windings, at least one of said windings of said first set of electrically conductive windings contained between two adjoining layers of said dielectric sheets; and
    (c) a first shielding layer disposed on a first exterior surface of said multilayer printed circuit board, said first shielding layer being disposed adjacent to and on one side of a winding of said first set of windings.

11. The power processing device according to claim 10, further including a second shielding layer disposed on a second exterior surface of said multilayer printed circuit board, said second shielding layer being disposed adjacent to and on the other side of said winding of said first set of windings.

12. The power processing device according to claim 11, further including an electrically conductive trace contained between two layers of said dielectric sheets, said conductive trace communicating with said first set of electrically conductive windings.

13. The power processing device according to claim 10, further including:
    (a) a set of quiet windings contained within said first set of windings; and,
    (b) a secondary set of windings positioned to have electrical flow induced therein by said core, said secondary set of windings positioned proximate to said quiet windings.

14. The power processing device according to claim 10, further including:
    (a) a secondary set of windings positioned to have electrical flow induced therein by said core; and,
    (b) an open loop positioned to inject a current through parasitic capacitance in said secondary windings, said injected current having a polarity opposite that of current in said first set of windings.

15. The power processing device according to claim 10, further including:
(a) a secondary set of windings positioned to have electrical flow induced therein by said core; and,
(b) further including an open loop positioned proximate and on a second side of said secondary windings.

16. A power processing device comprising:
(a) a multilayer printed circuit board having multiple layers of dielectric sheets;
(b) a transformer having,
1) a core extending through said layers of dielectric sheets, and,
2) a first set of electrically conductive windings, at least one of said windings of said first set of electrically conductive windings contained between two adjoining layers of said dielectric sheets, and at least one of said windings positioned on an external surface of said multilayer printed circuit board.

17. The power processing device according to claim 16, further including a first shielding layer is disposed on an exterior surface of said multilayer printed circuit board.

18. The power processing device according to claim 16, further including an electrically conductive trace contained between two layers of said dielectric sheets, said conductive trace communicating with said first set of electrically conductive windings.

19. The power processing device according to claim 18, further including at least one component secured to an exterior surface of said multilayer printed circuit board at a location over said electrically conductive trace.

20. A power processing device comprising:
a) a multilayer printed circuit board having multiple layers of dielectric sheets;
b) a transformer having,
1) a first core extending through said layers of dielectric sheets, and
2) a first set of electrically conductive windings contained between two adjoining layers of said dielectric sheets;
an output choke having,
1) a first core extending through said layers of dielectric sheets, and
2) a first set of electrically conductive windings, at least one of said windings of said first set of electrically conductive windings contained between two adjoining layers of said dielectric sheets;
an output choke having,
1) a second core extending through said layers of dielectric sheets, and
2) a second set of electrically conductive windings, at least one of said windings of said second sheet of electrically conductive windings contained between two adjoining layers of said dielectric sheets; and
d) at least one electrically conductive trace extending between said first set of electrically conductive windings and said second set of electrically conductive windings, said at least one electrically conductive trace totally contained between two adjoining layers of said dielectric sheets.

21. The power processing device according to claim 20, further including an output choke having:
(a) a third core extending through said layers of dielectric sheets;

(b) a third set of electrically conductive windings, at least one of said windings of said third set of electrically conductive windings contained between two adjoining layers of said dielectric sheets; and
(c) at least one trace extending between said first set of electrically conductive windings and said third set of electrically conductive windings, said at least one trace totally contained between two adjoining layers of said dielectric sheets.

22. A power processing device comprising:
(a) a multilayer printed circuit board having multiple layers of dielectric sheets;
(b) a first magnetic element having,
1) a first core extending through said layers of dielectric sheets, and
2) a first set of electrically conductive windings, at least one of said windings of said first set of electrically conductive windings contained between two adjoining layers of said dielectric sheets;
a second magnetic element having,
1) a second core extending through said layers of dielectric sheets, and
2) a second set of electrically conductive windings, at least one of said windings of said second set of electrically conductive windings contained between two adjoining layers of said dielectric sheets; and
2) at least one electrically conductive trace extending between said first set of electrically conductive windings and said second set of electrically conductive windings, said at least one electrically conductive trace totally contained between two adjoining layers of said dielectric sheets.

23. The power processing device according to claim 22, further including a third magnetic element having:
(a) a third core extending through said layers of dielectric sheets;
(b) a third set of electrically conductive windings, at least one of said windings of said third set of electrically conductive windings contained between two adjoining layers of said dielectric sheets; and
at least one trace extending between said first set of electrically conductive windings and said third set of electrically conductive windings, said at least one trace totally contained between two adjoining layers of said dielectric sheets.

24. The power processing device according to claim 22, further including an active element secured to said multilayered printed circuit board and connected to the first set of electrically conductive windings.

25. The power processing device according to claim 24, further including:
(a) a heat sink connected to one face of said multilayered printed circuit board opposing said active element; and
(b) a thermal via thermally connecting said active element and the heat sink.

26. The power processing device according to claim 23, further including:
(a) a base plate having an active element thereon; and
(b) a lead communicating between the active element on said base plate and said first set of electrically conductive windings.

27. The power processing device according to claim 26, wherein said electrically conductive trace in communication with said lead is totally contained between two adjoining layers of said dielectric sheets.

28. A power processing device comprising:
(a) a multilayer printed circuit board having multiple layers of dielectric sheets;
(b) a magnetic element having,
  (1) a core extending through said layers of dielectric sheets, and
  (2) a set of electrically conductive windings, at least one of said windings of said set of electrically conductive windings contained between two adjoining layers of said dielectric sheets;
(c) at least one electrically conductive trace, each electrically conductive trace communicating with one of said set of electrically conductive windings and totally contained between two adjoining layers of said dielectric sheets.

29. A power processing device comprising:
(a) a multilayer printed circuit board having multiple layers of dielectric sheets; and
(b) a transformer having
  1) a core extending through said layers of dielectric sheets, and
  2) a first set of electrically conductive windings at least one of said windings of said first set of electrically conductive windings contained between two adjoining layers of said dielectric sheets, and at least one of said windings positioned on an external surface of said multilayer printed circuit board; and
a first shielding layer disposed on an exterior surface of said multilayer printed circuit board.

30. A power processing device comprising:
(a) a multilayer printed circuit board having multiple layers of dielectric sheets; and
(b) at least one magnetic element;
(c) each magnetic element having a core extending through the layers of dielectric sheets, and
(d) each magnetic element having a set of electrically conductive windings contained between two adjoining layers of the dielectric sheets;
the board having first and second outer faces, each having an available surface of area A,
at least one of the first and second outer faces having electrical components secured thereon on the available surface,
the conductive windings contained betweedn the two adjoining layers of the dielectric sheets defining one or more footprints with an area equal to at least 20% or more of the area A, and
at least one electrical component secured to an outer surface being secured at a location that is directly over or under the winding footprint.

31. The power processing device according to claim 30, wherein multiple magnetic elements include multiple magnetics elements include multiple cores extending through the layers of dielectric sheets, and having multiple sets of electrically conductive windings contained between adjoining layers of the dielectric sheets, and the sets of electrically conductive windings having footprints totaling at least 20% of A in area.

32. The power processing device according to claim 37, wherein the at least one electrical component secured to an outer surface is a surface mounted component and has connectors electrically connected to the winding over or under the footprint of which the component is secured.

33. The power processing device according to claim 32, wherein the connectors are connected to the winding by conductive vias extending through one of more layers of the board between the connectors and winding connection points over or under the connectors, whereby conductor impedance is minimized by the resultant short, direct connections.

34. The power processing device according to claim 30, wherein the one or more footprints of the conductive windings has an area of 25% or more of the area A.

35. The power processing device according to claim 30, wherein the at least one of the electrical components is an active element.

36. The power processing device according to claim 30, wherein multiple electrical components are secured on an outer surface of the circuit board directly above or under the winding footprint.

37. The power processing device according to claim 30, wherein the at least one magnetic element comprises a plurality of magnetic elements having cores extending through the layers of dielectric sheets, the cores reducing the area available on surfaces of the board by in excess of 20% of the total area within the board perimeter.

38. The power processing device according to claim 30, wherein the device further comprises power components located on one surface of the board and connect by low thermal impedance paths to connections for an external heatsink on the remaining surface of the board.

39. The power processing device according to claim 38, wherein the low thermal impedance paths are vias.

40. The power processing device according to claim 38, wherein the low thermal impedance paths are large parallel pads.

41. A power processing device comprising:
  (a) a multilayer printed circuit board having multiple layers of dielectric sheets;
  (b) at least one magnetic element;
  (c) the at least one magnetic element having a core extending through the layers of dielectric sheets and forming a closed magnetic path extending through the layers, and
  (d) the at least one magnetic element having at least one set of electrically conductive windings contained between two adjoining layers of the dielectric sheets;
the board having first and second outer faces,
at least one of the first and second outer faces having electrical components secured thereon on the available surface,
the conductive windings contained between the two adjoining layers of the dielectric sheets defining one or more footprints, and
at least one electrical component secured to an outer surface being secured at a location that is directly over or under the winding footprint.

42. The power processing device according to claim 41, wherein power components of the device are located on one of the first and second outer faces of the multilayer printed circuit board and are thermally connected by at least one thermally conductive path to the other of the outer faces of the board for thermally conductive connection there to a heatsink.

43. The power processing device according to claim 42, wherein the at least one thermally conductive path is at least one of a thermally conductive via and a thermally conductive pad.

44. The power processing device according to claim 42, wherein windings of the at least one and second magnetic elements are directly interconnected by a trace printed on the same inner layer surface as the windings.

45. The power processing device according to claim 44, wherein at least one power component mounted on the exterior surface or surfaces of the multilayer board above or below a winding is electrically connected to that winding by at least one conductive via.

46. The power processing device according to claim 41, wherein the core comprises at least two legs extending through the layers of dialectric sheets.

47. The power processing device according to claim 46, wherein the conductive windings contained between two adjoining layers of the dielectric sheets include windings wound on each of the at least two legs of the core.

48. The power processing device according to claim 47, wherein the core comprises three legs extending through the layers of dielectric sheets, the conductive windings contained between adjoinin layers of the dielectric sheet include windings wound on at least two of the three legs of the core.

49. The power processing device according to claim 47, further comprising:
 (e) a second magnetic element,
 (f) the second magnetic element having a second core extending through the layers of the dielectric sheets and forming a second closed magnetic path extending through the layers, and
 (g) the second magnetic element having a second set of electrical conductive windings contained between two adjoining layers of the dielectric sheets.

50. The power processing device according to claim 49, wherein each of the at least one and second cores comprises at least two legs extending through the layers of the dielectric sheets.

51. The power processing device according to claim 46, wherein the at least one magnetic element is a main transformer of the power processing device and the second magnetic element is an input or an output choke.

52. The power processing device according to claim 49, further comprising:
 (h) a third magnetic element,
 (i) the third magnetic element having a third core extending through the layers of the dielectric sheets and forming a third closed magnetic path extending through the layers, and
 (j) the third magnetic element having a third set of electrical conductive windings contained between two adjacent layers of the dielectric sheets.

53. The power processing device according to claim 52, wherein each of the at least one, the second and the third cores comprises at least two legs extending through the layers of the dielectric sheets.

54. The power processing device according to claim 52, wherein the at least one magnetic element is a main transformer of the power processing device and the second and the third magnetic elements are an input and an output choke.

* * * * *

UNITED STATES PATENT AND TRADEMARK OFFICE
CERTIFICATE OF CORRECTION

PATENT NO. : 6,980,074 B1
DATED : December 27, 2005
INVENTOR(S) : Ionel Jitaru It is certified that error appears in the above-identified patent and that said Letters Patent is hereby corrected as shown below:

<u>Title page,</u>
Item [56], References Cited, FOREIGN PATENT DOCUMENTS,
delete "7/1999" and insert -- 7/1989 --.

Signed and Sealed this

Sixteenth Day of May, 2006

JON W. DUDAS
*Director of the United States Patent and Trademark Office*